(12) United States Patent
Sumitomo et al.

(10) Patent No.: US 8,358,069 B2
(45) Date of Patent: Jan. 22, 2013

(54) LIGHTING METHOD OF LIGHT SOURCE APPARATUS

(75) Inventors: Taku Sumitomo, Hyogo (JP); Toshio Yokota, Shizuoka (JP)

(73) Assignees: Ushio Denki Kabushiki Kaisha, Tokyo (JP); Engergetiq Technology, Inc., Woburn, MA (US)

( * ) Notice: Subject to any disclaimer, the term of this patent is extended or adjusted under 35 U.S.C. 154(b) by 232 days.

(21) Appl. No.: 12/659,323

(22) Filed: Mar. 4, 2010

(65) Prior Publication Data

US 2010/0225232 A1  Sep. 9, 2010

(30) Foreign Application Priority Data

Mar. 4, 2009 (JP) ................................. 2009-050161

(51) Int. Cl.
*H01J 17/16* (2006.01)
*H05G 2/00* (2006.01)
*H05B 37/02* (2006.01)

(52) U.S. Cl. ............... 313/635; 250/504 R; 315/111.21; 315/158

(58) Field of Classification Search .......... 445/5; 134/1, 134/42; 315/326, 84.51, 32, 111.01, 111.21, 315/158, 291; 313/635, 110, 567; 250/504 R
See application file for complete search history.

(56) References Cited

U.S. PATENT DOCUMENTS

| 5,557,170 | A  | * | 9/1996  | Ooms ........................... 313/635 |
| 6,356,700 | B1 | * | 3/2002  | Strobl .......................... 385/147 |
| 2004/0264512 | A1 | * | 12/2004 | Hartlove et al. ................. 372/5 |
| 2007/0228300 | A1 | * | 10/2007 | Smith ....................... 250/504 R |
| 2009/0015163 | A1 | * | 1/2009  | Becker et al. ................. 313/631 |

FOREIGN PATENT DOCUMENTS

| DE | 10133073 C1 | * | 7/2002 |
| JP | 2005123144 A | * | 5/2005 |

* cited by examiner

*Primary Examiner* — Jacob Y Choi
*Assistant Examiner* — Henry Luong
(74) *Attorney, Agent, or Firm* — Rader, Fishman & Grauer PLLC

(57) ABSTRACT

A method of lighting a light source apparatus that has a discharge lamp, a reflection mirror for reflecting light emitted from the discharge lamp, a light emission optical system for irradiating a work piece with light, one or more laser oscillator for emitting a laser beam to the discharge lamp, and a discharge starting unit for starting discharge. The method includes removing deposits adhering to an inner face of the discharge lamp by irradiating a discharge vessel with the laser beam from the first laser oscillator, starting discharge in the discharge vessel by the discharge starting unit, and condensing the laser beam from a second laser oscillator, into the discharge vessel.

5 Claims, 6 Drawing Sheets

LIGHTING METHOD OF LIGHT SOURCE APPARATUS

CROSS-REFERENCES TO RELATED APPLICATION

This application claims priority from Japanese Patent Application No. 2009-050161 filed Mar. 4, 2009, the contents of which are incorporated herein by reference in its entirety.

TECHNICAL FIELD

The present invention relates to a method of lighting a light source apparatus having a discharge lamp, which is used in an exposure apparatus for a manufacturing process of, for example, a semiconductor, a liquid crystal substrate, or a color filter, or which is used for a fiber lighting apparatus for a medical endoscope or decorative illumination.

BACKGROUND

In recent years, in such manufacturing processes of, for example, a semiconductor, a liquid crystal substrate, or a color filter, the processing time thereof is shortened, and one time exposure to a work piece having a large area, etc. is advanced by using an ultraviolet light source with large input electric power. With such advances, emission of light with higher brightness is required for a high pressure discharge lamp, which is an ultraviolet light source. However, when input electric power to such a high pressure discharge lamp is simply increased, a load to electrodes arranged inside a discharge vessel thereof increases, so that there is a problem that the high pressure discharge lamp is blackened due to material evaporated from the electrodes, whereby a life span thereof is shortened.

As to the technology of a light source apparatus, U.S. Patent Application Publication No. 2007/0228300, which was recently published, teaches the technology of a LDLS (Laser-Driven Light Source) in which a light with a high brightness is emitted by supplying energy by laser to a gas, which is in an ionization state in a discharge vessel space. FIG. 6 shows a structural example of such a light source apparatus, for explaining the laser driven light source technology disclosed in U.S. Patent Application No. 2007/0228300. A brief description of the structure thereof will be given below, referring to the figure. A laser beam is emitted from a laser oscillator 804, so as to reach a collimator 812 through a fiber cable 808. The laser beam 816, formed into parallel light at the collimator 812, is condensed at an optical lens 820, thereby forming a laser beam 824 having a small diameter, and directed at an area 830 in a chamber 828 corresponding to an discharge vessel of a discharge lamp, in which a plasma 832 exists. And a medium (gas), which is ionized between a pair of electrodes 840, is irradiated with the laser so as to emit a light with a high brightness.

According to the laser driven light source technology, high brightness light emission is deemed to be maintained by irradiation of laser. However, even though the laser driven light source technology is applied to a discharge lamp in which a pair of electrodes is arranged in an discharge vessel thereof, as in the conventional discharge lamp having electrodes between which voltage for maintaining discharge is impressed, deposits consisting of elements of the enclosure material in the discharge vessel, which mainly consist of spattered electrode material, increase gradually on the inner face of the discharge vessel, as the lighting time progresses, so that it is impossible to prevent a blackening from becoming visible. Moreover, even in a non-electrode type discharge lamp in which electrodes are not arranged in an discharge vessel thereof, depending on the cooling conditions of an discharge vessel wall etc., vapor from aggregation substances of, for example, sulfur, mercury, etc., which are contents thereof, adheres to the discharge vessel wall, so that a phenomenon of opacity of the discharge vessel, which is equivalent to the blackening of the electrode discharge lamp, may happen.

Thus, due to the blackening of the discharge vessel, or due to the vapor from aggregation substances of, for example, sulfur, mercury, etc., which are contents thereof, adhering to the discharge vessel wall, it turns out that, it becomes hard to start discharge in the discharge vessel thereof in the case of a discharge-starting unit for which a laser is used, or, discharge may not be stably maintained after the discharge begins in the discharge vessel in the case of a discharge-starting means for which an electrode is used, even though a laser is emitted thereto to maintain discharge.

SUMMARY

Accordingly, it is an object of the present invention to offer a method of lighting a light source apparatus to immediately realize a high brightness lamp discharge by eliminating the influence of the deposits on an inner face of a discharge vessel, and emitting a laser into a discharge vessel to inject energy.

To solve the above problem, the present method of lighting a light source apparatus having a discharge lamp, a reflection mirror for reflecting light emitted from the discharge lamp, a light emission optical system for irradiating a work piece with light, one or more laser oscillators for emitting a laser beam to the discharge lamp, and a discharge starting unit for starting discharge, comprises: removing deposits adhering to an inner surface of the discharge lamp by irradiating an discharge vessel with the laser beam from a first laser oscillator, starting discharge in the discharge vessel by the discharge starting unit, and condensing the laser beam from a second laser oscillator, into the discharge vessel.

In the above method, a pair of electrodes may be arranged inside the discharge vessel of the discharge lamp of the light source apparatus, and the discharge lamp may have a power supply for impressing lamp voltage, which serves as the discharge starting unit, in which the discharge starting unit makes the power source for impressing lamp voltage impress the starting voltage between the pair of electrodes.

In the above method, the first laser oscillator may serve as the second laser oscillator.

In the above method, the discharge starting unit may condense a laser beam from a third laser oscillator into the discharge vessel.

In the above method, one of the first, second or third laser oscillators may serve at least two of the first, second, or third oscillators.

In the above method of lighting the light source apparatus according to the present invention, energy injection is carried out by laser irradiation in the discharge vessel after eliminating the influence of the deposits on the inner face of the discharge vessel, thereby immediately realizing the high brightness lamp discharge.

BRIEF DESCRIPTION OF THE DRAWINGS

Other features and advantages of the present lighting method of a light source apparatus will be apparent from the ensuing description, taken in conjunction with the accompanying drawings, in which.

DESCRIPTION

Figure 1:
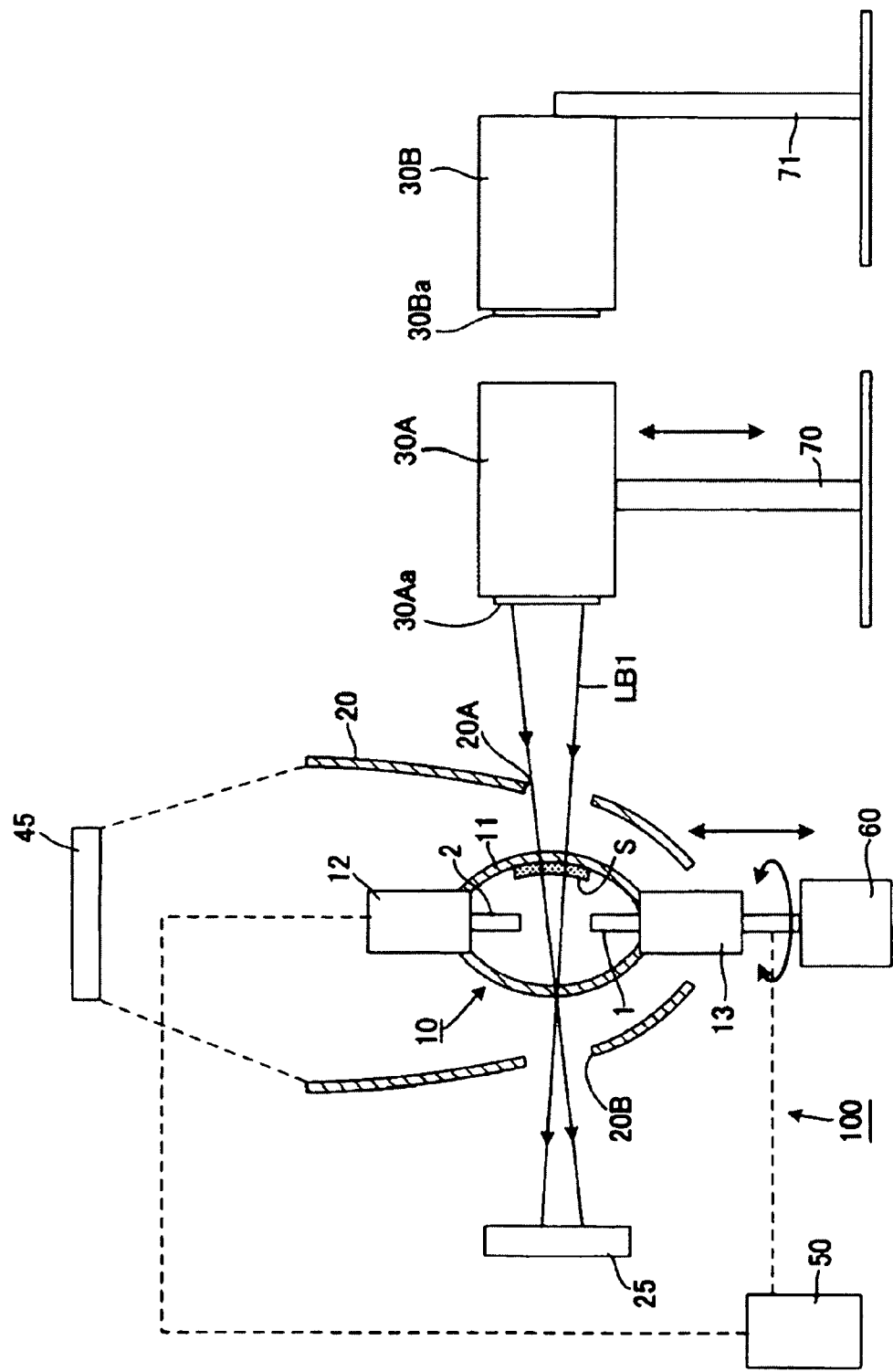
FIG. 1 shows a structural example of a light source apparatus for explaining an embodiment of the present invention.
Figure 2:
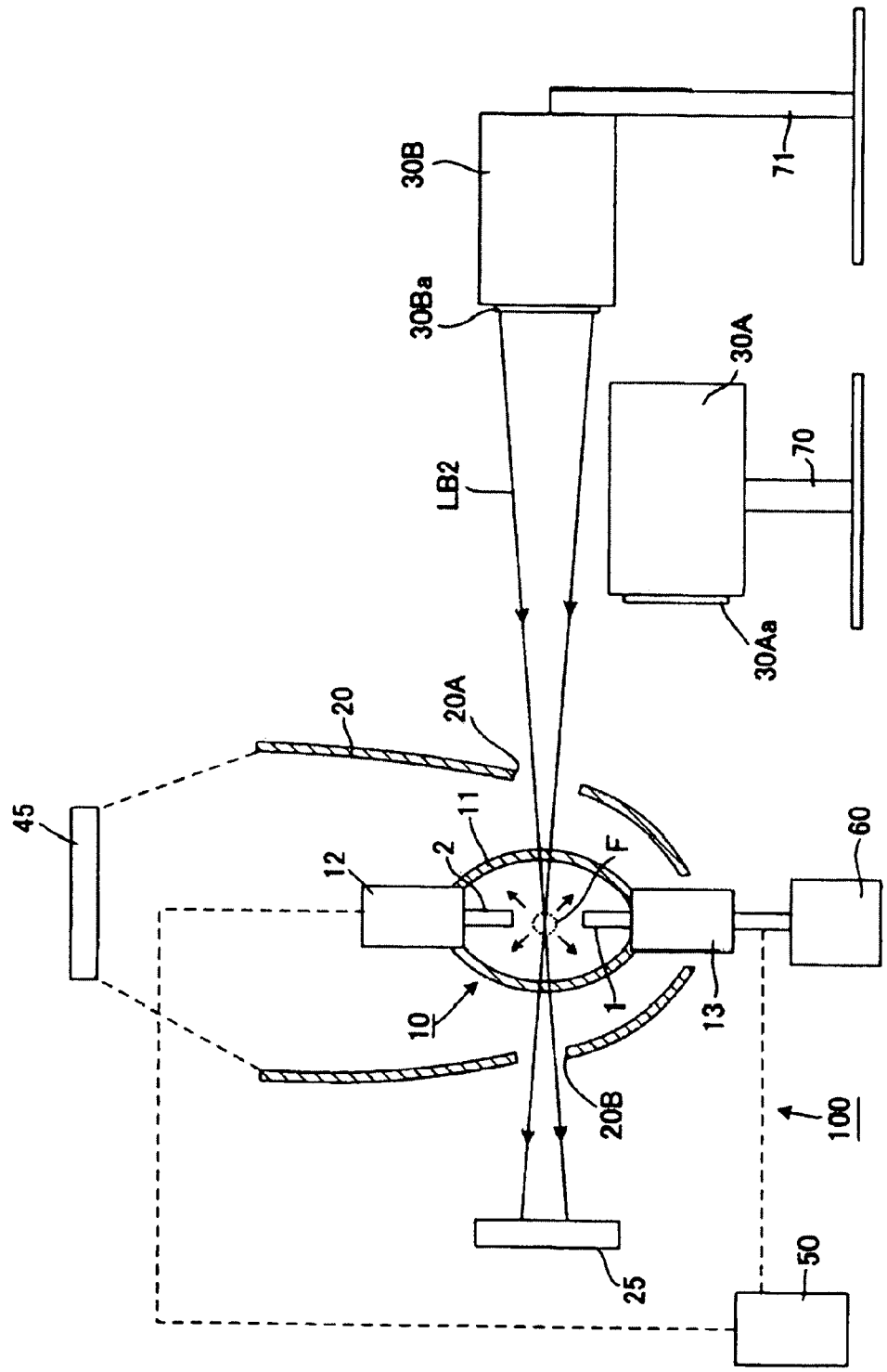
FIG. 2 shows an arrangement example of a light source apparatus of FIG. 1.
Figure 3:
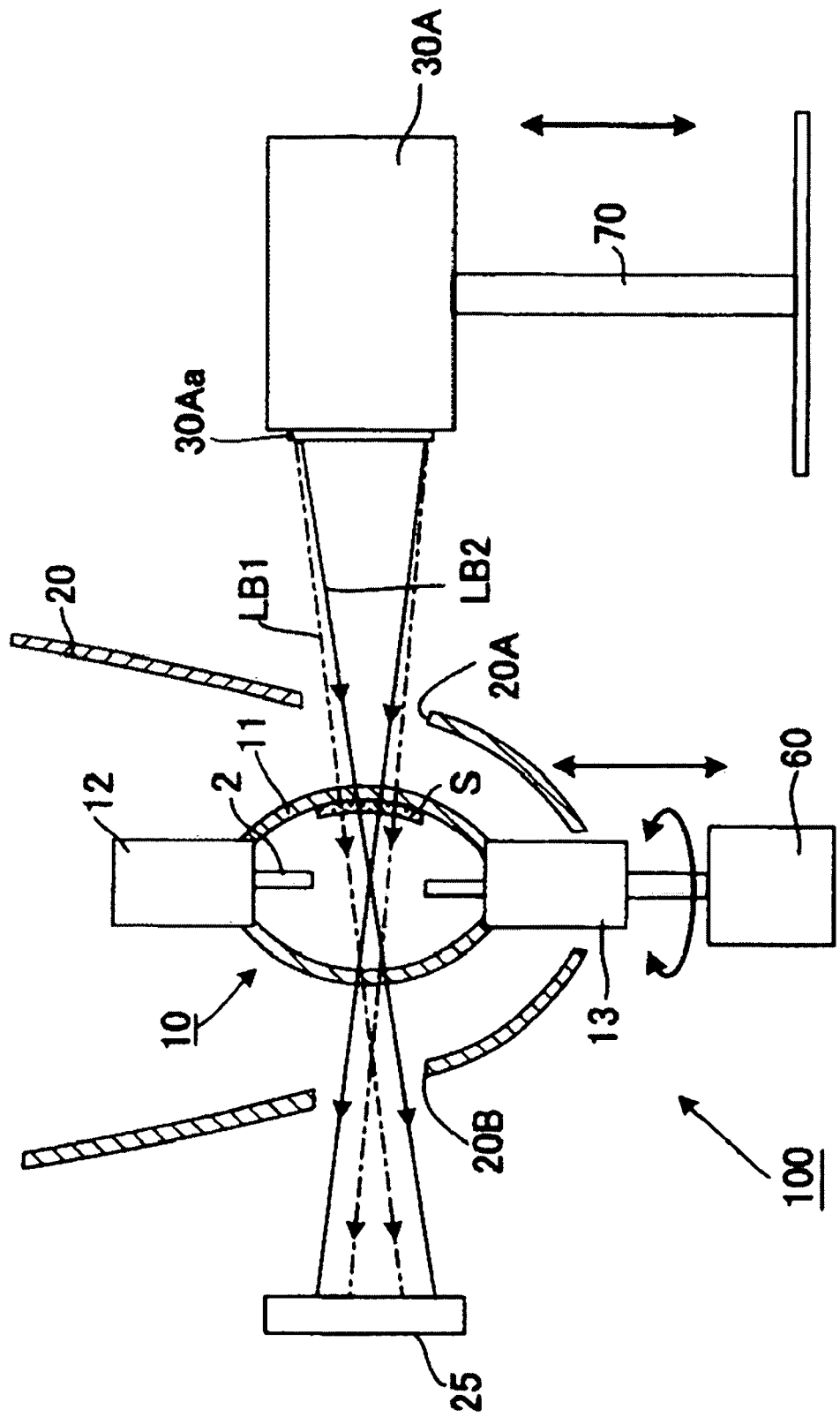
FIG. 3 shows another structural example of a light source apparatus for explaining an embodiment of the present invention.

An embodiment of the present invention will be described below. FIGS. 1-3 show structural examples of a light source apparatus 100 to which the present invention is applied. In FIG. 1, the light source apparatus 100 comprises: a discharge lamp 10 in which a pair of electrodes 1 and 2 are arranged to face each other inside an discharge vessel 11 thereof, and to which sealing portions 12 and 13 are provided; a concave reflection mirror 20 which reflects light emitted from the discharge lamp 10; a light emission system 40 which irradiates a work piece (not shown) with light reflected on the concave reflection mirror 20; a first laser oscillator 30A provided on a first laser oscillator stage 70, which emits a laser beam LB1 to the discharge lamp 10; a second laser oscillator 30B provided on a second laser oscillator stage 71; and a power supply 50 for lamp voltage impression.

In the present invention, a lighting method of a light source apparatus 100 comprises three stages as set forth below. (1) A first stage is removing deposit S, which has adhered to an inner face of the discharge vessel 11, by irradiating the discharge vessel 11 with the laser beam LB1 from the first laser oscillator 30A. In FIG. 1, the discharge lamp 10 can be rotated by a predetermined angle, for example, 180 degrees, counterclockwise or clockwise with respect to an optical axis of the lamp respectively by a drive mechanism (not shown) installed in a lamp stage 60 on which the lamp is provided, The first laser oscillator 30A is positioned so that a laser beam emitting window 30Aa faces an incidence hole 20A of the concave reflection mirror 20, thereby emitting the laser beam LB1 toward the discharge vessel 11. In this case, since the intensity of the laser beam LB1, with which the discharge vessel 11 is irradiated, is required to have only energy intensity capable of evaporating and scattering the deposit S, it is not necessary to condense it so as to have a focal point on the inner face of the discharge vessel 11. The first laser oscillator 30A is moved up and down in parallel with the optical axis of the lamp, thereby positioning the laser beam emitting window at a predetermined height.

The laser beam LB1, which passes through the discharge vessel 11, is absorbed by a beam damper 25. The deposit S is originated from, for example, metal material, which forms the electrodes 11 and 12, metal vapor, or metal halide vapor, which is luminescent species, or other impurities material, which exists in the discharge vessel.

(2) In a second stage, the laser beam emitted into the discharge vessel from the first laser oscillator 30A is stopped, and voltage is supplied between the pair of electrodes 1 and 2 arranged in the discharge vessel by a power supply 50 for lamp, which serves as a discharge starting unit. In this stage, ionized light emitting material is generated in the discharge vessel 11.

(3) As shown in FIG. 2, in a third stage, the first laser oscillator 30A is retracted downwards (or upwards). Instead, a laser beam LB2 is condensed at a point between the pair of electrodes 1 and 2 arranged inside the discharge vessel 11 from a laser beam emitting window 30Ba of the second laser oscillator 30B. Light emission with a high brightness takes place at the condensing point F by condensing the laser beam LB2 inside the discharge vessel 11.

In addition, as shown in FIG. 3, the first laser oscillator 30A may serve as the second laser oscillator 30B in the present invention. Although not shown in FIG. 3 which shows the laser beam emitting window 30Aa of the first laser oscillator 30A, a beam expander, which expands the diameter of a laser beam so as to have a focal point at a predetermined position ahead of the laser, is provided, wherein after the laser beam LB1, which evaporates the deposit S in the discharge vessel 11, is emitted so that the deposit S in the discharge vessel 11 is removed, the laser beam LB2 is emitted. The laser beams LB1 and LB2, which pass through the discharge vessel 11 are absorbed by, for example, the beam damper 25. In FIG. 3, the power supply for lamp, wiring, and the light emission system are not shown.

Although a lamp in which both ends are sealed is exemplified as a discharge lamp to which the present invention is applied, the present invention is not limited thereto. The discharge lamp may be used in which a pair of electrodes whose axes are approximately parallel to each other, projected from a single sealing portion to an electrical discharge space, or arranged so that the tips of the electrodes face each other within the electrical discharge space.

Figure 5:
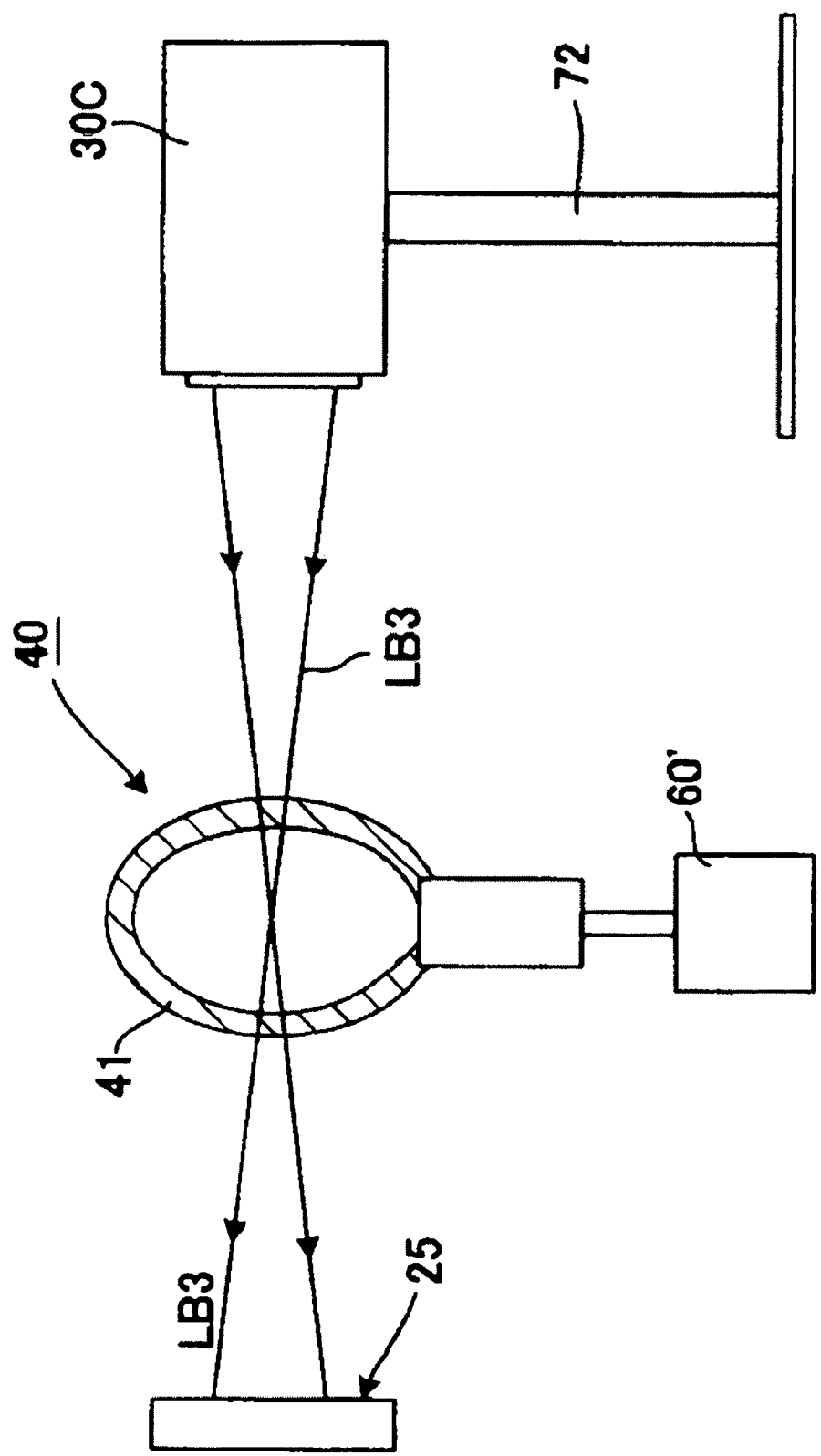
FIG. 5 shows a structural example of a discharge starting unit according to the present invention.
Figure 6:
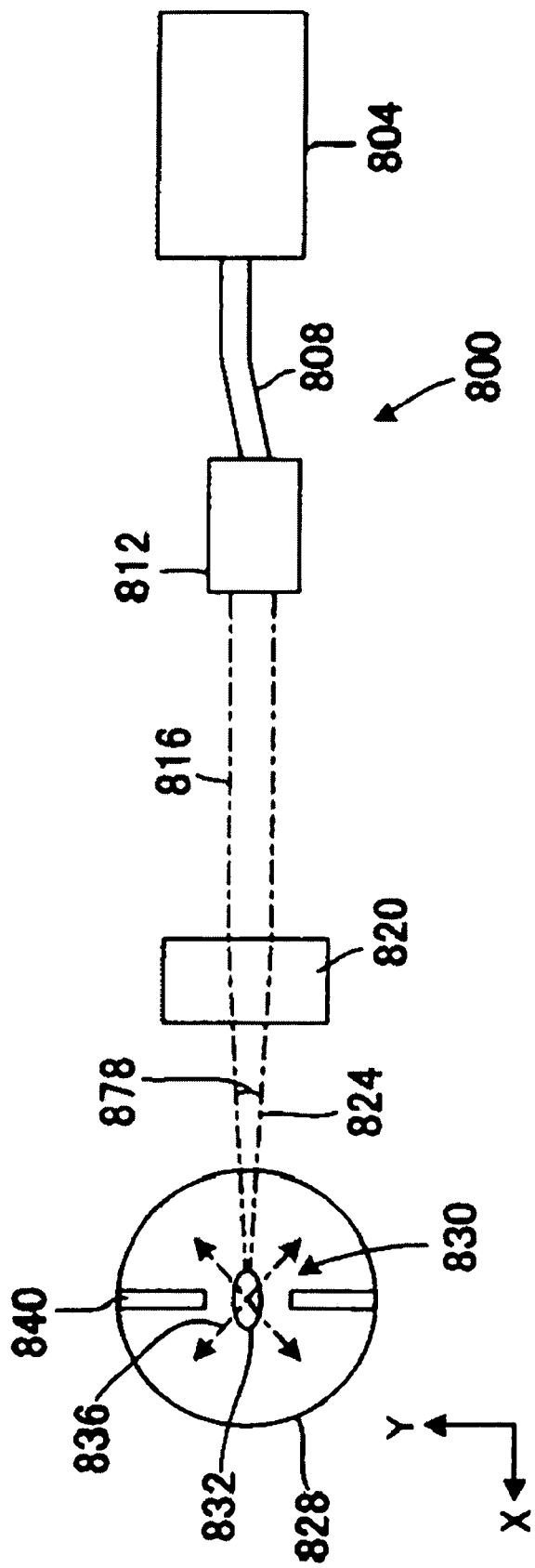
FIG. 6 shows a structural example of a conventional light source apparatus.

Moreover, the present invention may be applied to not only an electrode discharge lamp having electrodes but also a discharge lamp 40 having no electrode in a discharge vessel 41. In that case, as shown in FIG. 5, as to a discharge-starting unit, a laser beam LB3 emitted from a pulse laser oscillator which serves as a third laser oscillator 30C provided on a third laser oscillator stage 72 is condensed in the discharge vessel 41 of the discharge lamp 40 arranged on a lamp stage 60'. The laser beam LB3 which passes through the discharge vessel 41 reaches a beam damper 25. The first and second laser oscillators are not shown in this figure.

In addition, the first laser oscillator, which removes the deposit adhering to the inner face of the discharge vessel, the second laser oscillator for maintaining discharge, and the third laser oscillator, which serves as a discharge starting unit of the discharge lamp having no electrode, may be prepared separately from one another. However, in view of a miniaturization and weight saving of light source apparatus, and economical consideration thereof, it is desirable that one laser oscillator serve as all the laser oscillators, or as at least two laser oscillators.

Moreover, the concave reflection mirror of the light source apparatus to which the present invention is applied, may be an ellipse reflection mirror, which has a face of ellipsoid of revolution for condensing reflected light, or may be a parabolic reflector forming parallel light from reflected light, depending on a work piece to be irradiated. Therefore, the shape and the number of optical components, which are arranged between the concave reflection mirror and the work piece to be irradiated, are suitably selected, depending on the specification of light to be used.

Figure 4:
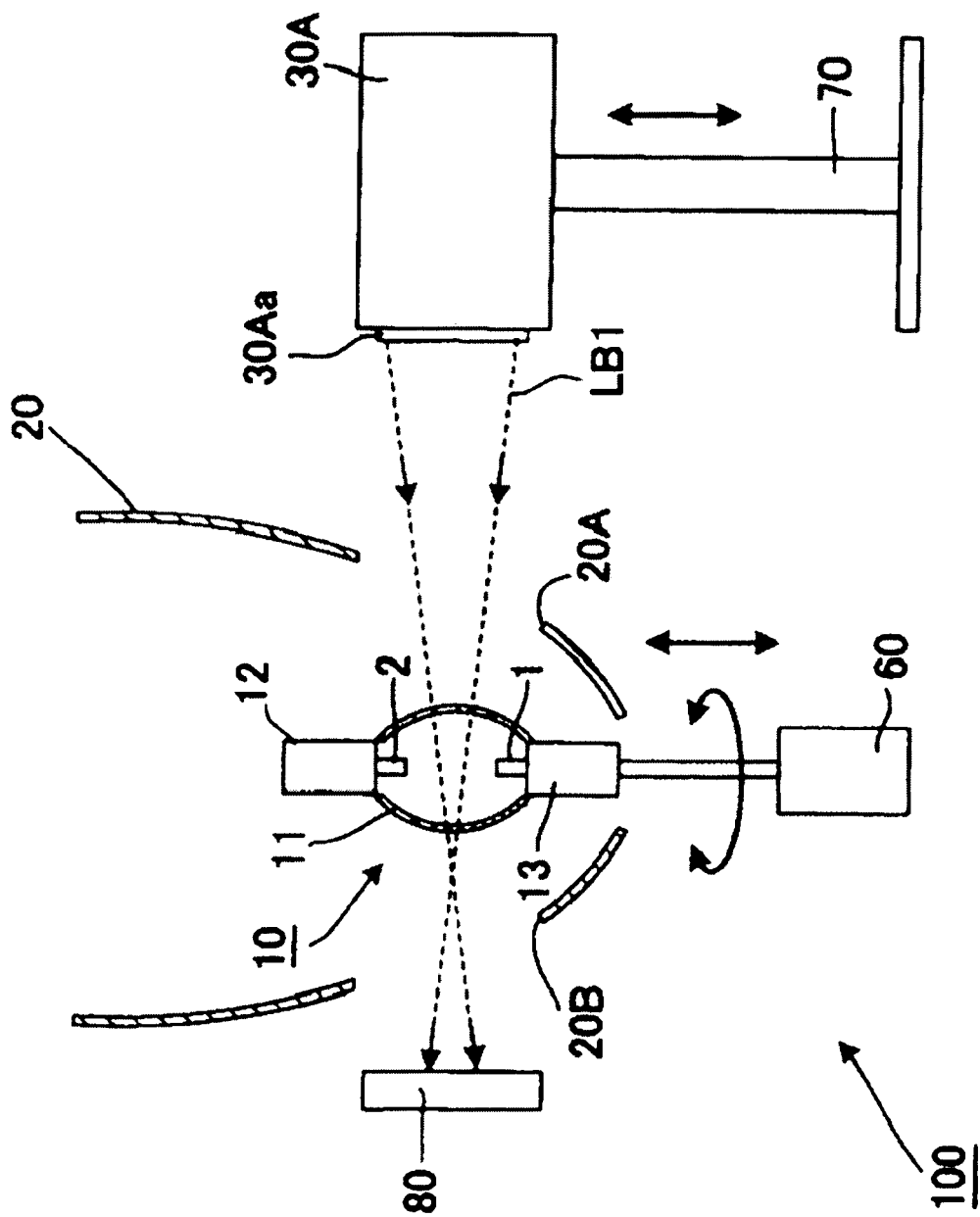
FIG. 4 shows a structural example of a light source apparatus for confirming the effects of the present invention.

Next, an experimental example according to the present invention will be described below, in order to show that deposits in the discharge vessel of the discharge lamp are removed. FIG. 4 is a schematic diagram of a light source apparatus 100 equipped with a discharge lamp 10, which has a pair of electrodes 1 and 2 therein. A xenon lamp was used as the discharge lamp 10. This figure shows that the entire deposit S of the discharge vessel 11 was removed. The discharge lamp 10 was arranged in a concave reflection mirror 20. A discharge vessel 11 of the discharge lamp 10 was made of quartz glass, and was 180 mm in full length. The maximum outer diameter of the discharge vessel 11 portion was 42 mm. The length of respective sealing portions 12 and 13 was 60 mm, and the outer diameter of the sealing portions was 22 mm. Xenon gas of 2 MPa was enclosed in the discharge vessel 11. The electrodes 1 and 2 was made of tungsten, and the distance between the electrodes was 4 mm, and were turned on at rated current 75 A and rated voltage 27 V. In FIG. 4, a power supply for lamp voltage impression, wiring and a light emission system are not shown.

An incidence hole 20A and an emission hole 20B of a first laser oscillator 30A were formed in the concave reflection mirror 20. The incidence hole 20A and the emission hole 20B were 80 mm in diameter respectively, and had a width of an opening, respectively, through which the discharge vessel 11 could be seen. The discharge lamp 10 was fixed to a lamp stage 60 through sealing portions 12 and 13. The lamp stage 60 could move the discharge lamp 10 in the up-and-down directions of a lamp axial direction while the discharge lamp 10 could be rotated with respect to the lamp axial direction. The first laser oscillator 30A was a fiber laser type, from which a laser beam with a wavelength of 1070 nm was emitted. A condenser lens (not shown) was provided on a light emission mouth 30Aa of the first laser oscillator 30A, and the discharge lamp 10 was irradiated with the condensed laser beam LB 1.

When the laser beam LB1 of rated 500 W was irradiated, the laser irradiation portion irradiated by the discharge vessel 11 became 2 mm in diameter. The energy density in the laser irradiation portion was approximately $1.5 \times 10^4$ W/cm$^2$. The intensity of the laser beam LB1 which passed through the discharge vessel 11 was measured with a power meter 80 arranged ahead of the emission hole 20B of the concave reflection mirror 20. When the lamp in which the inner face of the discharge vessel 11 was blackened with the deposit S, immediately after laser beam irradiation, only the laser beam of the energy of about 20 W could reach the power meter 80. Then, when irradiation of the laser beam continued, a value indicated by the power meter 80 went up gradually, and reached 400 W after about 10 seconds, and after that, it became a fixed value.

On the other hand, when laser beam intensity in the arrangement shown in FIG. 4 was evaluated in the same manner, in case of an unused discharge lamp in which there was no blackening of an inner face of the discharge vessel 11 due to a deposit, a value indicated by the power meter became fixed at 400 W. From this, it was thought that when the laser beam passed through the discharge vessel 11, part of the laser beam (equivalent to 100 W) was reflected. That is, it was considered that after about 10 seconds, the laser, beam which passed through the discharge lamp, removed the blackening matter that was the deposited, and passed therethrough completely. And it was confirmed that while the discharge lamp 10 was slowly rotated while emitting the laser beam, the discharge lamp 10 was moved in the up-and-down direction, so that the deposits on the inner surface of the discharge lamp, which was blackened, was removed nearly completely.

Although the discharge lamp 10 was moved up and down in this embodiment, the first laser oscillator 30A may be moved up and down, so as to obtain the same effects. Although the intensity of a laser beam, which passed through a discharge vessel 11, was measured with the power meter, what is necessary in an actual apparatus is just the absorber of laser energy such as the beam damper 25 shown in FIGS. 1-3.

The kind of a discharge lamp used for the light source apparatus according to the present invention is not limited to a xenon lamp. For example, the same effects can be obtained even if it is a mercury lamp, a metal halide lamp, or a low-pressure mercury lamp. In the present invention, the laser of the first, second or third laser oscillators may have a wavelength that passes through the discharge vessel, such as YAG laser, and fiber laser, semiconductor laser. And although, as to an oscillation system of laser, the third laser oscillator needs to be a pulse oscillation type, the first and second laser oscillators may be a continuous wave (CW) oscillation type, or a pulse oscillation type.

The preceding description has been presented only to illustrate and describe exemplary embodiments of the present lighting method of a light source apparatus. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A method for generating light, comprising the steps of: providing a light source device including a discharge lamp with a discharge vessel having a deposit formed thereon and a discharge starting unit for starting discharge, the discharge starting unit including a pair of electrodes disposed apart from one another and arranged inside the discharge vessel of the discharge lamp and a power supply operative for supplying voltage between the pair of electrodes;

irradiating the discharge vessel with a laser beam from a first laser oscillator, the laser beam having only an energy intensity sufficient in a period of time that nearly completely removes the deposit consisting of elements of an enclosure material in the discharge vessel, increase gradually on an inner face of the discharge vessel as a lighting time progresses or an aggregation substances of which are contents thereof;

after the irradiating step, starting discharge in the discharge vessel by the discharge starting unit so that the power source supplies voltage between the pair of electrodes to generate ionized light emitting material; and after the starting discharge step, condensing the laser beam from a second laser oscillator at a condensing point located generally centrally within the discharge vessel containing ionized light emitting material to generate light.

2. The method according to claim 1, the first laser oscillator serves as the second laser oscillator.

3. The method according to claim 1, wherein the discharge starting unit is to condense a laser beam from a third laser oscillator into the discharge vessel.

4. The method according to claim 3, wherein one of the first, second, or third laser oscillators serves at least two of the first, second, or third oscillators.

5. The method according to claim 1, further comprising the step of rotating the discharge lamp during the irradiating step.

* * * * *